United States Patent [19]

Inui et al.

[11] Patent Number: 4,941,920
[45] Date of Patent: Jul. 17, 1990

[54] SINTERED TARGET MEMBER AND METHOD OF PRODUCING SAME

[75] Inventors: Tsutomu Inui, Yonago; Shun-ichiro Matsumoto, Yasugi; Rokuo Ichiyasu, Yonago; Takeo Mizuguchi, Yasugi, all of Japan

[73] Assignee: Hitachi Metals, Ltd., Tokyo, Japan

[21] Appl. No.: 274,561

[22] Filed: Nov. 23, 1988

[30] Foreign Application Priority Data

Nov. 25, 1987 [JP] Japan .................. 62-297256
Jun. 16, 1988 [JP] Japan .................. 63-148728

[51] Int. Cl.$^5$ .................. B22F 1/00
[52] U.S. Cl. .................. 75/246; 419/28; 419/29; 419/32; 419/33; 419/39; 419/48
[58] Field of Search .................. 419/28, 29, 32, 33, 419/48, 39; 75/246

[56] References Cited

U.S. PATENT DOCUMENTS

| | | | |
|---|---|---|---|
| 4,135,286 | 1/1979 | Wright et al. | 29/420 |
| 4,620,872 | 11/1986 | Hijikata et al. | 75/246 |
| 4,627,959 | 12/1986 | Gilman et al. | 419/61 |
| 4,824,481 | 4/1989 | Chatterjee et al. | 75/246 |

FOREIGN PATENT DOCUMENTS

| | | |
|---|---|---|
| 61-113759 | 5/1986 | Japan . |
| 61-120330 | 6/1986 | Japan . |
| 63-24060 | 2/1988 | Japan . |
| 63-118067 | 5/1988 | Japan . |

OTHER PUBLICATIONS

Summary of Lectures, 10th Meeting of Japan Applied Magnetics Association, Nov. 1986, p. 121.

Primary Examiner—Stephen J. Lechert, Jr.
Assistant Examiner—Nina Bhat
Attorney, Agent, or Firm—Finnegan, Henderson, Farabow, Garrett & Dunner

[57] ABSTRACT

A sintered target member consisting essentially of 50–75 weight % of Co, 3–12 weight % of Cr and balance substantially Ni, which has a structure comprising dispersion phases consisting essentially of one or more elements constituting the target member and having a maximum permeability of 50 or less. This target member is produced by mixing metal or alloy powders corresponding to low-permeability dispersion phases, charging the resulting mixture into a metal container; sealing the metal container under reduced pressure; sintering it at a temperature of 900°–1300° C. and pressure of 500 atm or more; and removing the metal container from the resulting sintered body.

11 Claims, 2 Drawing Sheets

(×210)

SINTERED TARGET MEMBER AND METHOD OF PRODUCING SAME

BACKGROUND OF THE INVENTION

The present invention relates to a target member for producing Co—Ni—Cr magnetic thin films for magnetic recording by a sputtering method, and to a method of producing such a target member.

Magnetic thin films of Co—Ni, Co—Ni—Cr, Co—Cr, etc. are produced by a sputtering method or a vapor deposition method. In the case of a sputtering method, a target member is usually made of an alloy having substantially the same composition as that of a magnetic thin film to be produced.

Target members of Co—Ni, Co—Ni—Cr, Co—Cr. etc. are conventionally produced by casting, and the cast products are cut to thin plates or their cast ingots are subjected to hot working to provide thin plates.

80 Co—20 Ni magnetic thin films for hard disks, typical examples as thin films of in-plane magnetization, are produced from targets having substantially the same compositions, and the targets themselves are produced by casting: or by hot or cold working of cast products.

On the other hand, thin films of in-plane magnetization consisting of Co—Ni—Cr, typically 63 Co—30 Ni—7 Cr were recently proposed (Japanese Patent Laid-Open No. 61-120330), and have been getting much attention.

The magnetic thin films consisting essentially of Co, Ni and Cr are superior to the conventional magnetic thin films of 80 Co—20 Ni in respect to magnetic properties such as a coercive force and a corrosion resistance. Accordingly, they have been increasingly substituting for 80 Co—20 Ni.

In the case of 80 Co—20 Ni targets, the transformation from a γ-phase to an ε-phase takes place in the step of cooling from high temperature in the process of producing such targets, because they contain 70 weight % or more Co. Accordingly, they are less magnetized in a low magnetic field, meaning that they have a magnetic flux density B of at most 7000 G or so at a magnetic field intensity H=1000 Oe and a low permeability.

On the other hand, in the case of 63 Co—30 Ni—7 Cr, an austenite structure appears by cooling from high temperature, and it shows a magnetic flux density B of about 10900 G at H=1000 Oe, and its maximum permeability is as large as 100 or more.

At present, most of sputtering apparatuses employ a magnetron system. In this magnetron system, a permanent magnet is placed just under a target member, and leakage magnetic field is generated just above the target member to trap electrons, thereby increasing the efficiency of the sputtering.

To generate this leakage magnetic field, an Alnico magnet or a rare earth magnet is used, but if the target member has a large permeability, magnetic flux passing through the target member increases, leading to the decrease in leakage magnetic field which contributes to the generation of plasma.

For this reason, in the case of a 63 Co—30 Ni—7 Cr target member, leakage magnetic flux for generating a plasma cannot be obtained without reducing the thickness of the target member. However, the thinner the target member, the shorter its service life, making It necessary to exchange the target member more frequently. In addition, the thinner the target member, tha more susceptible it is to partial erosion by sputtering, lowering the productivity of sputtered thin films.

Accordingly, consideration is being given to the reduction of permeability of a target member of this kind.

Various proposals have been made so far to achieve the above object. For instance, (a) A target member is subjected to a cold working treatment such as cold rolling, surface cutting, rough grinding, etc. to reduce its permeability (Japanese Patent Laid-Open No. 61-113759).

(b) A target member is produced in a porous form by a powder metallurgy method to reduce its permeability (Japanese Patent Laid-Open No. 63-24060).

(c) A target member is produced in such a structure that non-magnetic phases of Ag, NbC, etc. are dispersed so that they can function as magnetic gaps which generate leakage magnetic flux on a surface of the target member [Japanese Patent Laid-Open No. 63-118067).

(d) A conventional, typical composition of 63 Co—30 Ni—7 Cr is changed to 70.9 Co—20.2 Ni—8.9 Cr to reduce its permeability (Summary of The 10th Lecture of Japan Applied Magnetic Association, November 1986, p. 121).

However, the above methods have their oWn problems. Specifically, in the method (a), when the level of cold working is increased to sufficiently reduce the permeability, strain introduced by cold working i$ increased, and it is released when the temperature of the t member is elevated by brazing thereof to a backing plate, causing the target member to be warped. As a result, good brazing cannot ba achieved, and a low permeability cannot be obtained stably by this method.

In the method (b), the resulting target member does not have sufficient mechanical strength because it is porous. Accordingly, it has a problem in handling.

In the method (c), the resulting target member contains non-magnetic phases of Ag, NbC etc. which are not made of elements essential for the target member. Accordingly, when this is subjected to sputtering to produce a magnetic thin film, necessary magnetic properties are not likely to be obtained.

In the method (d), the resulting target member is likely to have slightly deteriorated magnetic properties.

As described above, in has been difficult to reduce a permeability of a Co—Ni—Cr target member effectively by any of the conventionally proposed methods.

OBJECT AND SUMMARY OF THE INVENTION

Accordingly, an object of the present invention is to reduce a permeability of a Co—Ni—Cr target member, typically 63 Co—30 Ni—7 Cr, thereby providing a target member with improved plasma generating efficiency and a large thickness.

In the case of a Co—Ni—Cr sputtering target member, regardless of whatever combination of a Co—Ni—Cr alloy, pure metals of Co, Ni and Cr, and alloys consisting of two of these elements are used for the target member, a composition of the resulting sputtered thin film can be made equal by controlling sputtering conditions; if the same proportions of elements exist on a surface of the target member.

However, some combinations of elements of Co, Ni and Cr tend to have a hi9h permeability which is undesirable for a target member for sputtering. Accordingly, it should be achieved that substantially all phases existing in the target member have sufficiently low permeability.

In general, a Ni—Cr alloy, pure Co, pure Cr, a Co—Cr alloy and a Co—Ni alloy containing 7 weight % or more of Co have a low permeability.

It has been found that a target member having a low permeability can be obtained by sintering powder of pure metals or alloys having a low permeability in such proportions corresponding to the composition of a desired target member. The present invention is based on this finding.

Thus, the target member according to the present invention consists essentially of 50-75 weight % Co, 3-12 weight % Cr and balance substantially Ni, which ha$ a structure comprising dispersion phases consisting essentially of one or more elements constituting the target member and having a maximum permeability of 50 or less.

The method of producing a sintered target member according to the present invention comprises the steps of mixing low-permeability pure metal or alloy poWder to provide a starting material powder; charging the starting material powder into a metal container; sealing it under reduced pressure; sintering it at a temperature of 100-1300° C. pressure of 500 atm or more; and removing the metal container from the resulting sintered body.

DETAILED DESCRIPTION OF THE INVENTION

Figure 1:
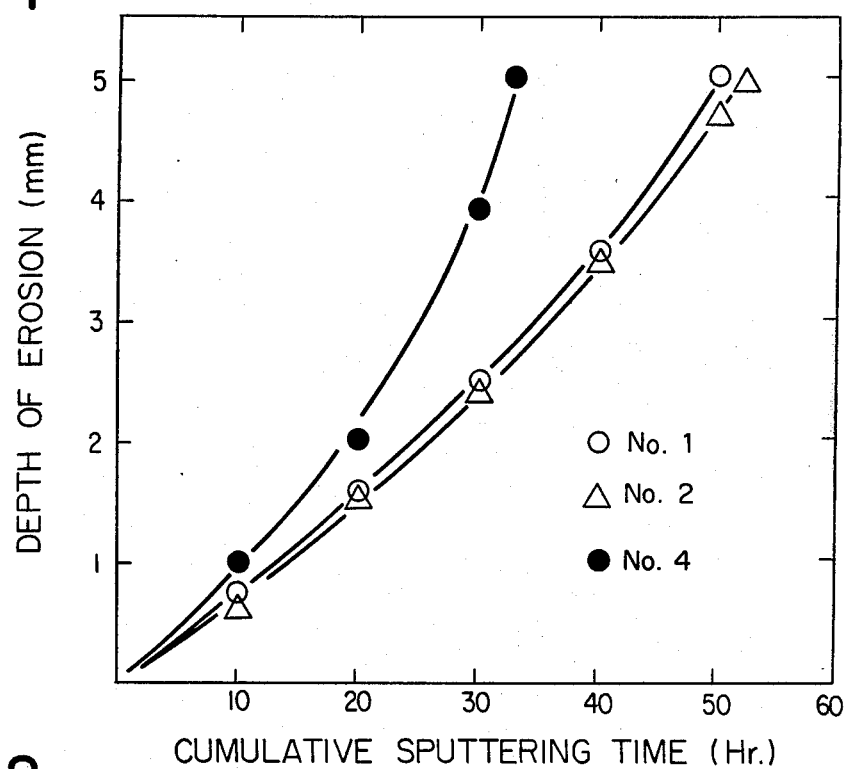
FIG. 1 is a graph showing the relations between the depths of erosion of the target members of Example 1 which were subjected to sputtering and cumulative sputtering time.

First, the sintered target member according to the present invention should have a composition equal to that of an aimed magnetic thin film which consists essentially 50-75 weight % Co, 3-12 weight % Cr and balance substantially Ni.

The reason for limiting the composition to 50-75 weight % of Co, 3-12 weight % of Cr and balance substantially Ni is as disclosed in the aforementioned Japanese Patent Laid-Open No. 61-120330, that a sputtered thin film of this composition has magnetic properties suitable for magnetic recording, specifically a coercive force of as high as 500 Oe or more.

Next, pure metals or alloys each having a low permeability are selected from various combinations of 3 elements of Co, Ni and Cr. Their typical examples are as follows:

(1) Pure Co

Pure Co has a large magnetic anisotropy and a maximum permeability of as small as about 30.

(2) Pure Cr

Pure Cr is non-magnetic.

(3) A Co—Cr alloy

When Cr is 22 weight % or more, this alloy is non-magnetic, but even when Cr is less than 22 weight %, its structure at room temperature is an ϵ-phase, whereby its maximum permeability can be suppressed to as loW as 50 or less.

(4) A Ni—Cr alloy

When Cr is 10 weight % or more, this alloy is non-magnetic.

(5) A Co—Ni alloy containing 70 weight % or more of Co

This alloY has a structure consisting of an ϵ-phase at a room temperature, so that it can have as low a permeability as 50 or less.

In the present invention, powders of the above pure metals or alloys are appropriately mixed to provide a composition consisting essentially of 50-75 weight % of Co, 3-12 weight % of Cr and balance substantially Ni. In this case, it should be noted .that the starting material powder is not limited to powders pure metals and alloys in the above (1)-(5), and that if a certain combination of the above metals or alloy cannot provide an aimed composition, powder of pure metals which are elements forming a sputtered thin film can appropriately be added.

Thus, the precondition of the Present invention is that a final composition of a sintered target member consists essentially of 50-75 weight % Co, 3-12 weight % Cr and balance substantially Ni, and the essential point is that this target member contains low-permeability phases consisting essentially elements constitutig the target member to such an extent that the target member has a lower permeability as a whole than the conventional one. Specifically, it should have as low a permeability as 50 or less as a whole.

Incidentally, since Ni, one of elements constituting a target member has a high permeability it should be avoided that it exists in a state of pure Ni except when its amount is extremely small. It is important that Ni exists in a target member in a state of a Co—Ni alloy or a Ni—Cr alloy.

Incidentally, as is clear from the above examples (1)-(5), the low-permeability phases are essentially made of one or more pure metals or alloys which form non-magnetic phases, ϵ-phases or phases having large magnetic anisotropy.

In particular, preferred examples of combinations of pure metals and alloys for achieving a low permeability are as follows:

(1) Co—Ni alloy powder containing 70 weight % or more of Co and Ni—Cr alloy powder.

Ni—Cr preferably contains 10 weight % or more of Cr. In this combination, a weight ratio of Co—Ni alloy powder to Ni—Cr alloy powder 60/40-90/10. Additional powder of pure Ni or pure Cr may be added alone or in combination to the mixture of Co—Ni alloy powder and Ni—Cr alloy powder, under the condition that the resulting sintered target member has a permeability of as low as 50 or less as a whole. To meet this condition, the amount of pure Ni added is generally 10 weight % or less based on the total composition, and the amount of pure Cr added is generally 5 weight % or less based on the total composition. (2) Pure Co powder and/or Co—Cr alloy powder, and Ni—Cr alloy powder containing 10 weight % or more of Cr.

In a combination of the pure Co powder and the Ni—Cr alloy powder, the pure Co powder is 50-75 weight %, and the Ni—Cr alloy powder is 25-50 weight %. In a combination of the Co—Cr alloy powder and the Ni—Cr alloy powder, the Co—Cr alloy powder is 50-80 weight %, and the Ni—Cr alloy powder is 20-50 weight %. And in a combination of the pure Co powder, the Co—Cr alloy powder and the Ni—Cr alloy powder, the amount of Co +Co—Cr is 50-80 weight %, and the Ni—Cr alloy powder is 20-50 weight %.

Sintered target members produced from the above powder combinations in (1) and (2) can achieve a maximum permeability of 50 or less.

The sintered target member of the present invention has a structure in which each metal or alloy powder is bonded to each other by sintering. For instance, in the case of the combination of the above (2), pure Co powder and/or Co—Cr alloy powder and Ni—Cr alloy powder containing 10 weight % or more of Cr are bonded to each other by sintering. It should be noted that each boundary between them is constituted by a diffusion bonding layer produced by sintering.

Incidentally, the Co—Ni—Cr sputtering target member of the present invention may contain 1.0-15 weight % of at least one of Nb and Ta to improve thin film characteristics, unless the characteristics of the basic composition of Co—Ni—Cr of the present invention are deteriorated by such additive elements. The preferred amounts of such additive elements are 2-8 weight % in totality.

The target member of the present invention can be produced by mixing the above powders to provide starting material powder, charging it into a metal container, sealing it under reduced pressure, sintering it at a temperature 900-1300° C. and pressure of 500 atm or more, and then removing the metal container from the resulting sintered body. If necessary, after sintering, it can be subjected to hot working to have a desired shape.

Each metal or alloy powder should have an appropriate particle size not exceeding 500 μm. When the particle size exceeds 500 μm, uniform dispersion of low-permeability phases in the resulting sintered target member cannot be achieved. And if such sintered target member is used for sputtering, the resulting thin film would have a composition variable with sputtering time. Therefore, a compositionally stable thin film cannot be obtained The desired particle size is 200 μm or less.

Metal and/or alloy powder is uniformly mixed and charged into a metal container. Since the metal container is subjected to high temperature and pressure during the sintering step, it should not be fused to the powder contained therein. Accordingly, the metal container is made of soft iron, etc.

The reason for limiting the sintering temperature and pressure to 900-1300° C. and 500 atm cr more is that these conditions can provide a strongly sintered product in which surface layers of the powder particles are uniformly bonded to each other.

Incidentally, sintering can- be conducted in any known methods such as hot isostatic pressing, etc.

The removal of the metal container can be conducted by any methods, for example, mechanical methods such as cutting, grinding, etc. or chemical methods.

The target member of the present invention contain substantially no elements other than those constituting the target, and does not have any strain which is introduced by working such as cold working In addition, despite the fact that it is a dense sintered body, it shows a low permeability More importantly, since the low-permeability metal or alloy particle phases are not fused together in the sintered target member, the target member's permeability is also as low as 50 or less as a whole.

Accordingly, without suffering from problems inherent in the conventional techniques, the target member of the present invention can have a smaller thickness than the conventional one while retaining sufficient leakage magnetic flux. Therefore, the target member of the present invention enjoys high efficiency and reduced time loss for exchanging.

The present invention will be explained in further detail by means of the following Examples.

Example 1

First, each starting material powder having a composition shown in the column of Composition in Each Powder in Table 1 was prepared by an inert gas atomizing method. This production was conducted as follows:

Each base material having a desired composition was produced by vacuum melting and casting. This base material was charged into a magnesia crucible having a spray nozzle at the bottom. The crucible was placed in a vacuum melting furnace, and the vacuum melting furnace was evacuated at $10^{-3}$ Torr or less, and the base material in the crucible was melted by high-frequency induction heating. After the base material was completely melted, a high-pressure Ar gas was introduced into a melt chamber of the crucible simultaneously with opening a valve of the spray nozzle. The melt was ejected through the spray nozzle together with the high-pressure Ar gas, thereby producing starting material powder. The starting material powder thus produced was subjected to classification to have 30 mesh or less, to remove flaky powder particles which cannot be uniformly mixed.

Next, each powder of the base materials was weighed and mixed in a V-type mixer to have a composition shown in the column of Formulation of Powder Mixture in Table 1.

Next, the uniformly mixed powder was charged into a capsule made of soft steel, and the capsule was evacuated to a degree of vacuum of $10^{-4}$ Torr. After evacuation at 400° C. for 4 hours or longer, an evacuation pipe of the capsule was sealed. The soft steel capsule charged with this powder was then subjected to hot isostatic pressing at a temperature of 1100° C. and pressure of 1000 atm to conduct pressure sintering. After removing this capsule from the hot isostatic press, it was subjected to hot rolling at a temperature of 1150° C. After that, the soft steel skin layer was mechanically removed, and a target member of 5 mm in thickness and 100 mm in diameter was produced.

The targets thus produced were measured with respect to their magnetic properties, and the results are shown in Table 2 together with those of a conventional target member produced by vacuum melting and hot rolling (No. 4 in Table 1). Among the magnetic properties shown in Table 2, the maximum permeability $\mu_m$ which largely affects the shape of erosion and the magnetic flux density B were compared between Samples. As a result, it was found that the target members of the present invention had smaller maximum permeability $\mu_m$ and magnetic flux density B than the conventional one produced by melting.

The target member of the present invention and the conventional one were set in a high-frequency magnetron sputtering apparatus to evaluate their sputtering characteristics. The sputtering conditions were as follows:

Initial degree of vacuum: $7 \times 10^{-7}$ Torr
Ar operation gas pressure: $5 \times 10^{-3}$ Torr
High-frequency output: 500 W
Incidentally, a magnet used for catching electrons was a samarium-cobalt magnet having a surface magnetic flux density of 4000 G.

With respect to sputtering characteristics, the relations between the depth of erosion at the end of its service life and cumulative sputtering time, and the relations between the strength of leakage magnetic field (leakage magnetic flux on a surface of a target member at a center position of erosion and cumulative sputtering time were investigated. The relation of erosion depth and cumulative sputtering time is shown in Table 1. It is clear from Table 1 that the targets of the present invention (No. 1 and No. 2) has 1.6 times as long a service life as the conventional one (No. 4).

Figure 2:
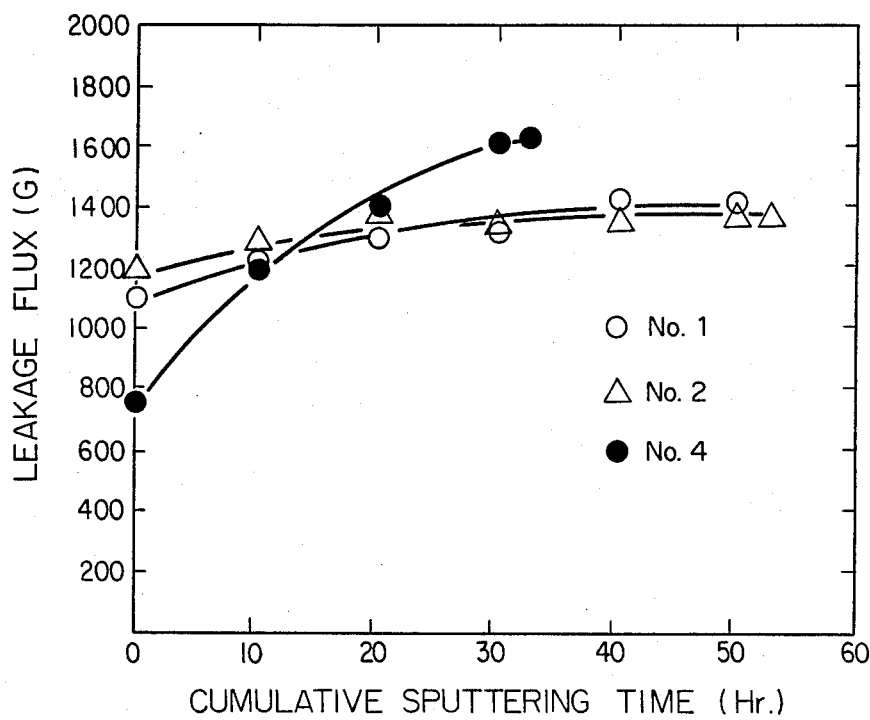
FIG. 2 is a graph showing the relations between leakage fluxes of the target members of Example 1 and cumulative sputtering time.

FIG. 2 shows the relations between the leakage flux on the target surface at a position of erosion and cumulative sputtering time. In the target members of the present invention, the variation of the surface leakage magnetic flux with the cumulative sputtering time is small, while it increases drastically in the conventional one (No. 4). This means that when the target member with large magnetic flux density B and maximum permeability $\mu_m$ is used for sputtering, the magnetic flux is concentrated at a position of erosion. As a result, plasma is concentration in this eroded portion.

Figure 3A:
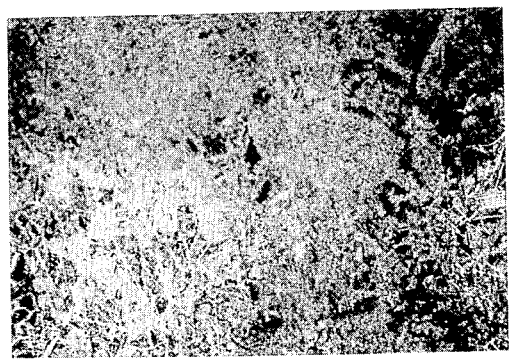
FIG. 3A is a photomicrograph showing the microsturcture of one target member of Example 1 (magnification; 210)
Figure 3B:
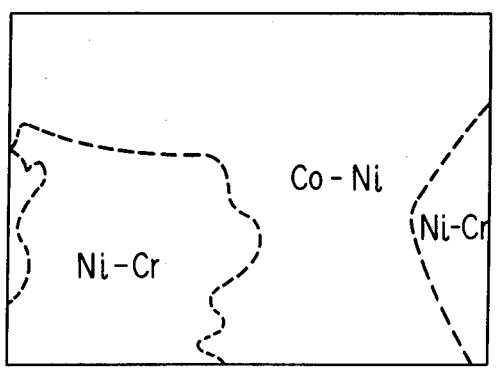
FIG. 3B is a schematic view of FIG. 3A.

FIG. 3A shows a photomicrograph of the target member of the present invention (No. 1) taken by a scanning electron microscope (SEM) (magnification: 210), and FIG. 3B shows the result of element identification by electron probe micro-analyzer (EPMA).

It was confirmed from FIGS. 3A and 3B that the magnetic Co—Ni particle phases and the non-magnetic Ni—Cr particle phases are well bonded to each other by pressure sintering.

TABLE 1

| Sample No. | Composition in Each Powder (weight %) | Formulation of Powder Mixture (weight %) | Method of Production |
|---|---|---|---|
| 1 | Co—20 Ni<br>Ni—35 Cr | Co—30 Ni—7.5 Cr | Hot isostatic pressing<br>↓<br>Hot rolling |
| 2 | Co—5.5 Cr<br>Ni—12 Cr | Co—29 Ni—7.0 Cr | Hot isostatic pressing<br>↓<br>Hot rolling |
| 3 | Co<br>Ni—20 Cr | Co—30 Ni—7.5 Cr | Hot isostatic pressing<br>↓<br>Hot rolling |
| 4 | — | Co—30 Ni—7.5 Cr | Vacuum melting<br>↓<br>Hot rolling |

Note:
Sample Nos. 1-3: Present invention Sample No. 4: Conventional target

TABLE 2

| Sample[1] No. | $B_{1000}$[2] (G) | $\mu_m$[3] |
|---|---|---|
| 1 | 5200 | 20 |
| 2 | 4800 | 30 |
| 3 | 5200 | 30 |

TABLE 2-continued

| Sample[1] No. | $B_{1000}$[2] (G) | $\mu_m$[3] |
|---|---|---|
| 4 | 10500 | 1300 |

Note
[1]Sample Nos. 1-3: Present invention Sample No. 4: Conventional target
[2]$B_{1000}$: Magnetic flux density at magnetic field intensity H = 1000 Oe
[3]$\mu_m$: Maximum permeability Example 2

Pure metal powder and alloy powder shown in the column of Composition in Each Powder in Table 3 were prepared. The method of producing the alloy powder was the same as in Example 1. The above powder was used to produce target members of 5 mm in thickness and 100 mm in diameter in the same manner as in Example 1.

Each target member was measured with respect to the magnetic properties. The results are shown in Table 4.

TABLE 3

| Sample No. | Composition in Each Powder (weight %) | Formulation of Powder Mixture (weight %) | Method of Production |
|---|---|---|---|
| 5 | Co—15.9 Ni—7.5 Ta<br>Ni—34 Cr | 61.3 Co—25.9 Ni<br>—6.8 Cr—6 Ta | Hot isostatic pressing<br>↓<br>Hot rolling |
| 6 | Co—4.5 Cr<br>Ni—11.8 Cr—9.2 Nb | 63.2 Co—26.7 Ni<br>—7 Cr—3.1 Nb | Hot isostatic pressing<br>↓<br>Hot rolling |
| 7 | Co—17.2 Ni<br>Ni—34 Cr, Ta | 61.3 Co—25.9 Ni<br>—6.8 Cr—6 Ta | Hot isostatic pressing<br>↓<br>Hot rolling |
| 4 | — | Co—30 Ni—7.5 Cr | Vacuum melting<br>↓<br>Hot rolling |

Note:
Sample Nos. 5-7: Present invention Sample No. 4: Conventional target

TABLE 4

| Sample[1] No. | $B_{1000}$[2] (G) | $\mu_m$[3] |
|---|---|---|
| 5 | 4700 | 30 |
| 6 | 5400 | 30 |
| 7 | 4800 | 30 |
| 4 | 10500 | 1300 |

Note
[1]Sample Nos. 5-7: Present invention Sample No. 4: Conventional target
[2]$B_{1000}$: Magnetic flux density at magnetic field intensity H = 1000 Oe
[3]$\mu_m$: Maximum permeability It is clear from Table 4 that the target members of the present invention (Nos. 5-7) have smaller maximum permeability and magnetic flux density than the conventional As explained above in detail, as a sputtering target member having a composition of 50-70 weight % Co, 3-12 weight % Cr and balance substantially Ni for producing thin films for magnetic recording, the sintered target member of the present invention which is produced substantially from alloy or metal powder having a low permeability has as small a maximum permeability as 50 or less as compared to the conventional target members produced by a melting method. Accordingly, the sintered target member of the present invention can have a larger thickness than the conventional one, enjoying less frequency of exchanging are higher productivity of sputtered thin films.

What is claimed is:

1. A sintered target member consisting essentially of 50–75 weight % of Co, 3–12 weight % of Cr and balance substantially Ni which has a structure comprising dispersion phases consisting essentially of one or more elements constituting said target member and having a maximum permeability of 50 or less.

2. The sintered target member according to claim 1, wherein said phases having a maximum permeability of 50 or less are one or more phases selected from the group consisting of non-magnetic metal phases, metal phases having an ε-phase structure and metal phases having large magnetic anisotropy.

3. A sintered target member consisting essentially of 50–75 weight % of Co, 3–12 weight % of Cr and balance substantially Ni, which has a structure comprising Co—Ni alloy dispersion phases containing 70 weight % or more of Co and Ni—Cr alloy dispersion phases containing 10 weight % or more of Cr, so that said target member has a maximum permeability of 50 or less.

4. A sintered target member consisting essentially of 50–75 weight % of Co, 3–12 weight % of Cr and balance substantially Ni, which has a structure comprising pure Co dispersion phases and/or Co—Cr alloy dispersion phases, and Ni—Cr alloy dispersion phases containing 10 weight % or more of Cr, so that said sintered target member has a maximum permeability of 50 or less.

5. A method of producing a sintered target member consisting essentially of 50–75 weight % of Co, 3–12 weight % of Cr and balance substantially Ni, comprising the steps of mixing starting material powder containing pure Co powder and/or pure Cr powder or at least one of alloy powders consisting essentially of two or more of Co, Cr and Ni; charging said starting material powder into a metal container; sealing said metal container under reduced pressure; sintering it at a temperature of 900–1300° C. and pressure of 500 atm or more; and removing said metal container from the resulting sintered body.

6. The method of producing a sintered target member according to claim 5, wherein said sintered body is further subjected to hot working and then said metal container is removed.

7. A method of producing a sintered target member consisting essentially of 50–75 weight % of Co, 3–12 weight % of Cr and balance substantially Ni, comprising the steps of mixing at least one of pure Co powder and Co—Cr alloy powder with Ni—Cr alloy powder containing 10 weight % cr more of Cr; charging the resulting mixture into a metal container: sealing said metal container under reduced pressure; sintering it at a temperature of 900–1300° C. and pressure of 500 atm or more; and removing said metal container from the resulting sintered body.

8. The method of producing a sintered target member according to claim 7, wherein said sintered body is further subjected to hot working and then said metal container is removed.

9. A method of producing sintered target member consisting essentially of 50–75 weight % of Co, 3–12 weight % of Cr and balance substantially Ni, comprising the steps of mixing Co—Ni alloy powder containing 70 weight % or more of Co with Ni—Cr alloy powder; charging the resulting starting material powder mixture into a metal container; sealing said metal container under reduced pressure; sintering it at a temperature of 900–1300° C. and pressure of 500 atm or more; and removing said metal container from the resulting sintered body.

10. The method of producing a sintered target member according to claim 9, wherein a mixture of said Co—Ni alloy powder and said Ni—Cr alloy powder is further mixed with at least one of Ni powder and Cr powder to provide said starting material powder.

11. A sintered target member consisting essentially of 50–75 weight % of Co, 3–12 weight % of Cr, 1.0–15 weight % of at least one of Nb and Ta, and balance substantially Ni, which has a structure comprising dispersion phases consisting essentially of at least one of elements constituting said target member and having a maximum permeability of 50 or less.

* * * * *

UNITED STATES PATENT AND TRADEMARK OFFICE
CERTIFICATE OF CORRECTION

PATENT NO. : 4,941,920

DATED : July 17, 1990

INVENTOR(S) : TSUTOMU INUI ET AL.

It is certified that error appears in the above-identified patent and that said Letters Patent is hereby corrected as shown below:

Claim 5, column 9, line 33, change "eSsentially" to --essentially--.

Claim 7, column 10, line 10, change "cr" to --or--.

Claim 8, column 10, line 18, change "and-then" to --and then--.

Signed and Sealed this

Second Day of July, 1991

*Attest:*

HARRY F. MANBECK, JR.

*Attesting Officer*   Commissioner of Patents and Trademarks